United States Patent [19]

Sekiguchi

[11] Patent Number: 4,958,200
[45] Date of Patent: Sep. 18, 1990

[54] OVERCURRENT PROTECTION CIRCUIT FOR SEMICONDUCTOR DEVICE

[75] Inventor: Takeshi Sekiguchi, Kanagawa, Japan

[73] Assignee: Sumotomo Electric Industries, Ltd., Osaka, Japan

[21] Appl. No.: 221,599

[22] Filed: Jul. 20, 1988

[30] Foreign Application Priority Data

Jul. 21, 1987 [JP] Japan ............................ 62-181553
Jul. 21, 1987 [JP] Japan ............................ 62-181554
Jul. 21, 1987 [JP] Japan ............................ 62-181555

[51] Int. Cl.$^5$ ................ H01L 39/22; H01L 23/48; H01L 23/02
[52] U.S. Cl. ............................... 357/5; 357/23.13; 357/65; 357/74; 505/922
[58] Field of Search ............. 357/5, 23.13, 65, 74; 505/1, 700–703, 850, 922, 923

[56] References Cited

U.S. PATENT DOCUMENTS

| | | | |
|---|---|---|---|
| 4,371,796 | 2/1983 | Takada ........................... | 357/5 |
| 4,554,567 | 11/1985 | Jilli et al. ......................... | 357/5 |
| 4,670,770 | 6/1987 | Tai .................................. | 357/75 |
| 4,837,609 | 6/1986 | Gurvitch et al. ................ | 357/5 |

FOREIGN PATENT DOCUMENTS

| | | | |
|---|---|---|---|
| 59-228781 | 12/1984 | Japan ............................ | 357/5 |
| 60-18978 | 1/1985 | Japan ............................ | 357/5 |
| 1-147877 | 6/1989 | Japan ............................ | 357/5 |

OTHER PUBLICATIONS

Ron Dagani; "Superconductivity: A Revolution in Electricity is Taking Shape", *Chemical and Engineering News* (May 11, 1987), pp. 7–16.

Primary Examiner—J. Carroll
Attorney, Agent, or Firm—Cushman, Darby & Cushman

[57] ABSTRACT

A semiconductor device in which at least a part of each of the current flow paths extending from the electrode pads of the semiconductor chip to the outer terminals of the semiconductor package is made of superconducting material. During operation, when an overcurrent applied to a lead pin exceeds the critical current of the superconducting material, the resistance is increased from zero, and the semiconductor chip is thereby protected from damage. The superconducting material may also be configured between the outer terminals of the semiconductor package so that a potential difference can be measured. Also, a magnetic field may be applied to the superconducting material so that the critical current value can be set.

4 Claims, 5 Drawing Sheets

OVERCURRENT PROTECTION CIRCUIT FOR SEMICONDUCTOR DEVICE

BACKGROUND OF THE INVENTION

1. Field of the Invention

The present invention relates to a semiconductor device which is formed by sealing a semiconductor chip in a package of resin, ceramic or the like for shipment. More particularly, the present invention relates to a semiconductor device which is provided with a circuit for protecting the semiconductor chip from overcurrent.

2. Description of the Prior Art

An example of such a circuit in the prior art is shown in FIG. 1. As shown, a protective circuit comprising diodes $D_1$ and $D_2$ and a resistor R is connected between a lead pin 1 provided outside the package and the semiconductor chip 2 inside the package. When a negative overvoltage is applied to the lead pin 1, an overcurrent caused by the overvoltage is allowed to flow through the diode $D_1$ from the earth side so that the semiconductor chip 2 will never be adversely affected. When, on the other hand, a positive voltage is applied to the lead pin 1, the resultant overcurrent is allowed to flow through the diode $D_2$ to the power source V so that in this case the semiconductor chip 2 also will never be adversely affected.

However, the above-described conventional semiconductor device suffers from the following problems. Namely, since it is necessary to provide one resistor and two diodes, the circuit is relatively intricate, and the number of components is unnecessarily large. Also, the high frequency characteristic of the device is lowered by the capacitance of the diodes.

Another example of protecting means for protecting a semiconductor chip from overcurrent comprises a current monitoring circuit provided between an external terminal to which overcurrent may be applied and a signal source (external circuit) for monitoring overcurrent. However, since in this method it is necessary to connect a resistor so as to cause a voltage drop between the external terminal and the signal source, it is rather difficult to apply a sufficiently large signal to the semiconductor chip through the external terminal during ordinary operation.

SUMMARY OF THE INVENTION

Accordingly, an object of this invention is to provide a semiconductor device which is so designed that it is simple in arrangement and its semiconductor chip is protected from overcurrent with the high frequency characteristic remaining unchanged.

Another object of this invention is to provide a semiconductor device which is so designed that it is simple in arrangement, its semiconductor chip is protected from overcurrent, and a sufficiently large signal can be applied to the semiconductor chip during ordinary operation.

Still another object of this invention is to provide a semiconductor device which is so designed that it is simple in arrangement, its semiconductor chip is protected from overcurrent with the high frequency characteristic remaining unchanged, and the allowable value of the overcurrent can be set to a desired value.

The foregoing objects of this invention have been achieved by the provision of a semiconductor device in which at least a part of each of the current flow paths extended from the electrode pads of the semiconductor chip to the outer terminals is made of superconducting material. Therefore, in the semiconductor device of the invention, when an overcurrent applied to a lead pin exceeds the critical current value of the superconducting material, the resistance is increased, thus protecting the semiconductor chip from damage.

Another feature of the semiconductor device according to the present invention resides in that at least a part of an electric current path which extends from at least one of the plurality of electrode pads to at least one of the plurality of external terminals is made of superconducting material, wherein one end of the part of the electric current path which is connected to the one electrode pad is connected to another one of the external terminals. Therefore, in the semiconductor device of the invention, when an overcurrent applied to the external terminal exceeds the critical current value of the superconducting material, the resistance is raised from zero, thus providing a potential difference between the monitoring external terminals. The overcurrent thus can be monitored by detection of the potential difference between the external terminals.

According to another feature of the semiconductor device of the present invention, at least a part of each of the electric current paths extended from the electrode pads of the semiconductor chip to the external terminals exposed outside the package is made of superconducting material, and magnetic means is provided for application of a magnetic field to that part of each of the current paths. Therefore, in the semiconductor device of the invention, when an overcurrent applied to any one of the external terminals exceeds the critical current value of the superconducting material, the resistance is raised from zero, thus protecting the semiconductor chip from damage. Also,. the critical current value can be set by application of the magnetic field formed by the magnetic means.

DETAILED DESCRIPTION OF THE PREFERRED EMBODIMENTS

The preferred embodiments of this invention will be described below with reference to FIGS. 2 through 8.

Figure 1:
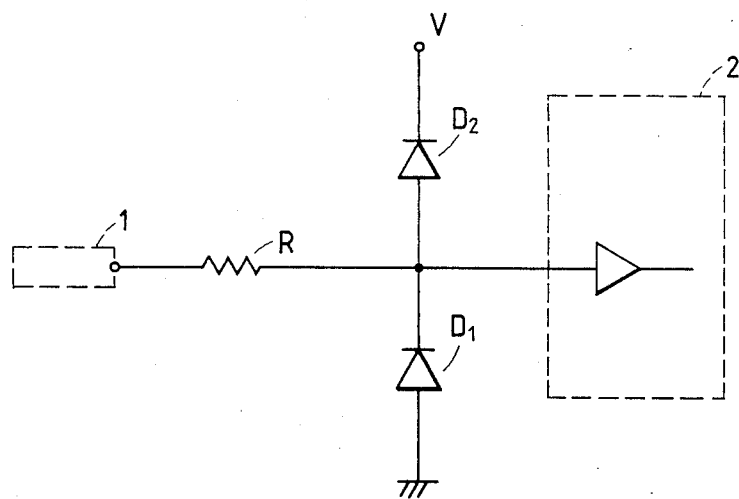
FIG. 1 is an explanatory diagram of a conventional overcurrent protection circuit for a semiconductor device.
Figure 2:
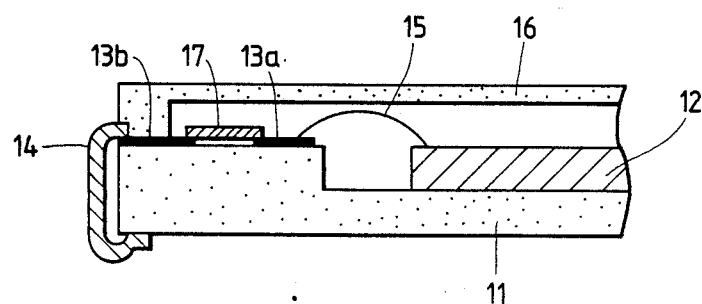
FIG. 2 is a sectional view showing essential parts of a semiconductor device according to a first embodiment of the present invention.

FIG. 2 is a sectional view showing a part of a semiconductor device according to a first embodiment of the invention. As shown in FIG. 2, a semiconductor chip 12 is die-mounted in the cavity of a package base 11, and inner leads 13a and 13b are formed in the periphery of the package base 11. Lead pins 14 electrically connected to the inner leads 13b are fixedly provided outside the package base 11. The inner leads 13a are connected through bonding wires 15 to the semiconductor chip 12. The package base having the above-described components is covered with a cap 16 securedly fixed thereto.

The semiconductor device of the invention further comprises conducting member 17 made of superconducting material which are fixedly provided between the inner leads 13a and 13b. A number of kinds of superconducting material are available for this purpose, as are a variety of semiconductor packages also available. The dimensions of the conducting member 17 are so determined that the overcurrent flowing to the semiconductor chip exceeds the critical current value of the conducting member immediately before exceeding the allowable value for the semiconductor chip.

The operation of the semiconductor device thus constructed now will be described.

The semiconductor device must be used at temperatures below the inherent critical temperature of the superconducting material of the conducting members 17. When, under this condition, a signal current is applied through the lead pin 14, the conducting member 17 is maintained superconductive, and its resistance is zero. However, when an overcurrent inputted through the lead pin 14 exceeds the critical current value of the superconducting material of the superconducting member 17, the resistance of the conducting member 17 is raised to a finite value from zero so that the semiconductor chip 12 is protected from the problems which would occur should the overcurrent flow into the semiconductor chip as it is. If the semiconductor device is so designed that after the resistance reaches the finite value the temperature of the conducting member 17 is raised by heat generated, thus exceeding the critical temperature of the superconducting material, then the overcurrent preventing function will become even more effective.

FIGS. 3 and 4 are external views of semiconductor devices to which the technical arrangement of FIG. 2 is applicable.

Figure 3A:
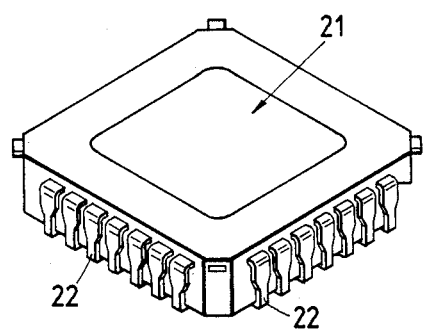
FIGS. 3(a)–3(d), 4(a) and 4(b) are external views of examples of a package to which the technical features of the first embodiment are applied.
Figure 3C:
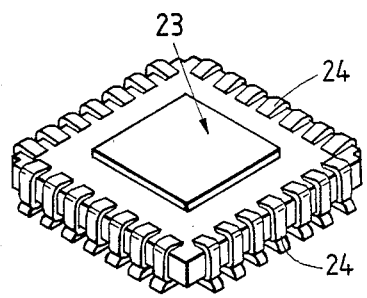
Figure 3B:
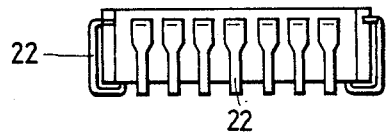

In the package shown in FIGS. 3(a) and 3(b), a semiconductor chip is sealed under a cap 21. In the package, lead pins 22 are made of superconducting material as shown in FIG. 2; however, conducting members of superconducting material also may be arranged inside the package, or may be provided along electrical paths to the semiconductor chip.

Figure 3D:
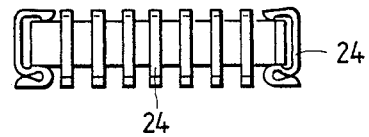

In a package as shown in FIGS. 3(c) and 3(d), on the other hand, a semiconductor is sealed under a cap 23, and lead pins 24 also are made of superconducting material as in FIG. 2. However, these conducting members of superconducting material also may be arranged inside the package, or may be provided along electrical paths to the semiconductor chip as in FIGS. 3(a) and 3(b).

Figure 4A:
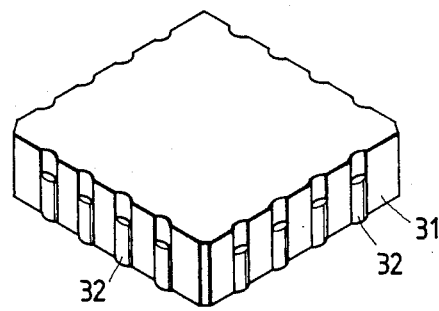
Figure 4B:
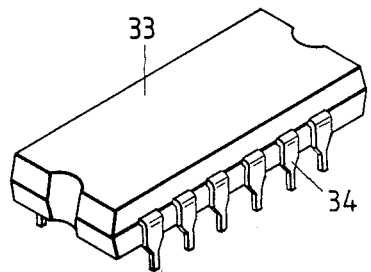

FIG. 4(a) shows a so-called "LCC" (leadless chip carrier) type package, in which electrode material members 32 are fixed to the outside of a package base 31 made of ceramic. FIG. 4(b), on the other hand, shows a so-called "DIP" (dual-in-line package), in which outer leads 34 are extended from the side wall of a package 33 made of resin. In these packages, the conducting members of superconducting material also can be arranged in the same manner as those in the packages shown in FIGS. 2 and 3.

For each package so arranged, when an overcurrent applied to the lead pin exceeds the critical current value of the conducting member of superconducting material, the resistance of the latter is increased from zero, thus protecting the semiconductor chip inside the device from damage. Thus, the semiconductor device of the invention, though simple in construction, can protect the semiconductor chip from overcurrent with the high frequency characteristic remaining unchanged.

Figure 5:
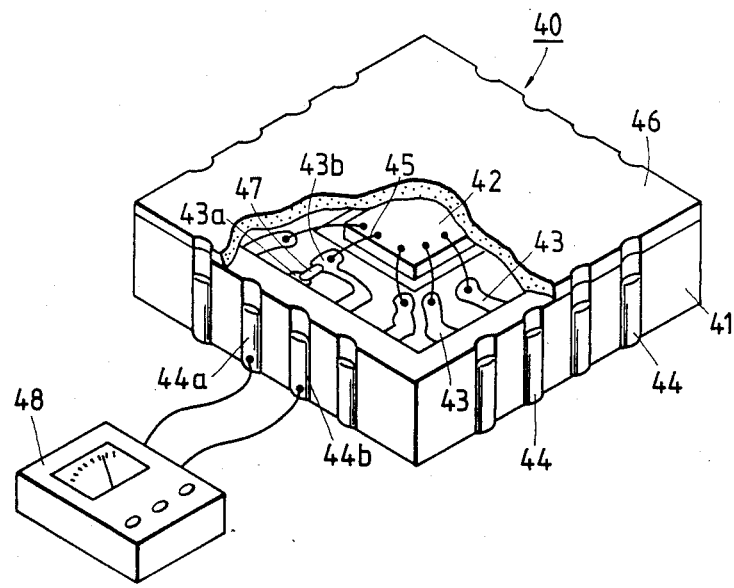
FIG. 5 is a perspective view, with parts cut away, showing essential parts of a semiconductor device according to a second embodiment of the present invention.

FIG. 5 is a perspective view, with parts cut away, showing a semiconductor device 40 according to second embodiment of the invention. As shown in FIG. 5, a semiconductor chip 42 is die-mounted in the cavity of a package base 41, and inner leads 43a and 43b are formed in the periphery of the cavity of the package base 41. Monitoring external terminals 44a and 44b electrically connected to the respective inner leads 43a and 43b and a plurality of external terminals 44 connected to a plurality of inner leads 43 are fixedly provided on the outside of the package base 41. The inner leads 43a and 43b are connected through bonding wires 45 to the semiconductor chip. The package base having those components is covered with a cap 46 fixedly secured thereto.

In the semiconductor device of FIG. 5, the inner lead 43a connected to the external terminal 44a used for receiving an input signal and for monitoring is connected through a conducting member 47 of superconducting material to the inner lead 43b connected to the external terminal 44b which is used only for monitoring. The dimensions of the conducting member 47 are so determined that an overcurrent flowing to the semiconductor chip exceeds the critical current value of the superconducting material immediately before exceeding the allowable value for the semiconductor chip. A monitoring device (such as a voltmeter) 48 for monitoring a potential difference is connected to the external terminals 44a and 44b.

The operation of the semiconductor device thus arranged now will be described.

The semiconductor device of FIG. 5 must be used at temperatures below the inherent critical temperature of the superconducting material of the conducting member 47. When, under this condition, an ordinary signal current or a current from the power source is applied to the semiconductor device through the external terminal 44a used for receiving an input signal and for monitoring (hereinafter referred to as "a first external terminal 44a", when applicable), the conducting member 47 is maintained superconductive, and its resistance is zero. However, when an overcurrent applied through the external terminal 44a exceeds the critical current value of the superconducting material of the conducting member 47, the resistance of the conducting member 47 is raised to a certain finite value from zero. As a result, a potential difference is developed across the conducting member 47 by the overcurrent, and this potential difference is applied across the external terminals 44a and 44b to the monitoring means 48, where it is detected.

If the semiconductor device is so designed that after the resistance reaches the certain, finite value from zero the temperature of the conducting member 47 is raised by heat generated, thus exceeding the critical temperature of the superconducting material, then the above-described overcurrent monitoring operation will be achieved even more effectively. Moreover, upon detection of the overcurrent in this way, the application of the supply voltage is suspended immediately, or a signal source circuit (not shown) is checked for trouble. Thus, the trouble can be detected prior to failure, and the semiconductor device can be protected.

The technical concept of the second embodiment is also applicable to semiconductor devices packaged as shown in FIGS. 3 and 4.

In the semiconductor device of the second embodiment, when an overcurrent applied to the lead pin exceeds the critical current value of the conducting member of superconducting material, the resistance of the latter is increased from zero so that a potential difference is provided between the pair of monitoring external terminals. Thus, the semiconductor device of the second embodiment of the invention, though simple in construction, can monitor the overcurrent without adversely affecting the signal input or power input under ordinary operating conditions.

Figure 6:
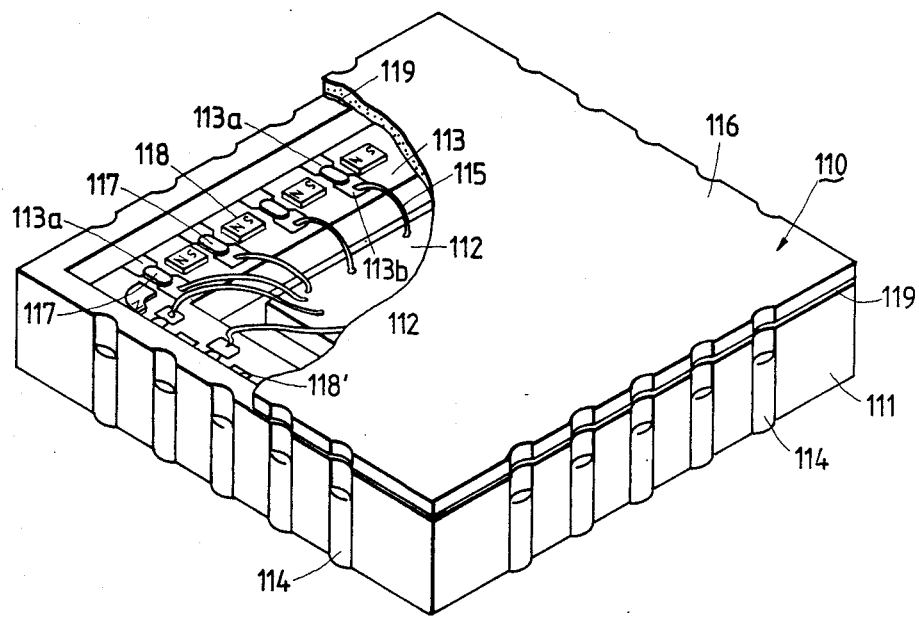
FIG. 6 is a perspective view, with parts cut away, showing essential parts of a semiconductor device according to a third embodiment of the present invention.

FIG. 6 is a perspective view, with parts cut away, showing a semiconductor device 110 according to a third embodiment of the invention. As shown in FIG. 6, a semiconductor chip 112 is die-mounted in the cavity of a package base 111, and inner leads 113a and lead pads 113b are formed on an inner lead forming surface 113 provided in the periphery of the package base 111. External terminals 114 are fixedly provided on the outer walls of the package base 111, and are connected electrically to the respective inner leads 113a. The lead pads 113b are connected through bonding wires 115 to the semiconductor chip 112. The package base is covered with a cap 116 which is secured thereto through a sealing member 119.

The semiconductor device of the embodiment of FIG. 6 further comprises conducting members 117 of superconducting material connected between the inner leads 113a and the lead pads 113b, respectively. The dimensions of the conducting member 117 are so determined that an overcurrent flowing to the semiconductor chip exceeds the critical current value of the superconducting material immediately before exceeding the allowable value of the semiconductor chip. Magnetic elements 118 also are provided adjacent to the conducting members 117 so that magnetic fields may be applied to the respective conducting members.

The operation of the semiconductor device thus arranged now will be described.

The semiconductor device of FIG. 6 must be used at temperatures below the inherent critical temperature of the superconducting material of the conducting member 117. When, under this condition, an ordinary signal current is applied to the device through an external terminal 114, the conducting member 117 is maintained superconductive, and its resistance is zero. However, when an overcurrent applied through the external terminal 114 exceeds the critical current value of the superconducting material of the conducting member 117, the resistance of the conducting member 117 is set to a certain value larger than zero so that the semiconductor chip 112 is protected from the possibility that the overcurrent will flow into the semiconductor chip as it is. If the semiconductor device is so designed that after the resistance reaches the aforementioned certain value the temperature of the conducting member 117 is raised by heat generated, thus exceeding the critical temperature of the superconducting material, then the overcurrent preventing function will become even more effective.

In the embodiment of FIG. 6, the magnetic elements 118 are provided so that magnetic fields may be generated to set the above-described critical current value. Namely, the critical current value can be adjusted for every external terminal by determining the critical current value or adjusting the critical current value separately according to the kind of semiconductor chip die-mounted in the package. The critical current value also may be adjusted according to the use or operating condition of the semiconductor device. Furthermore, in the embodiment of FIG. 6, the lines of magnetic force are formed only in the closed loops including the magnetic elements 118 and the conducting members of superconducting material, and therefore, the magnetic fields do not reach the semiconductor chip. That is, the electrical characteristic of the semiconductor chip will never be adversely affected by the provision of the magnetic elements 118.

Figure 7A:
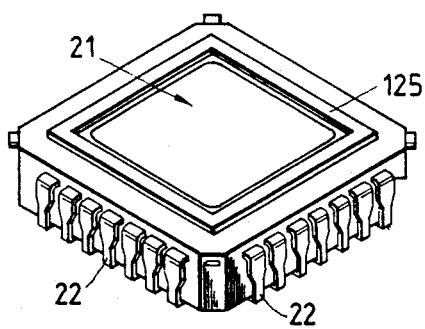
FIGS. 7(a), 7(b) and 8 are external views of examples of a package to which the technical features of the third embodiment of the present invention are applied.
Figure 7B:
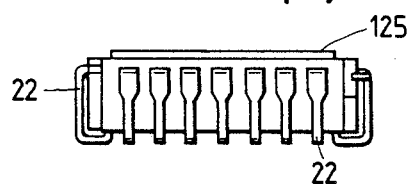

The third embodiment is also applicable to semiconductor devices packaged as shown in FIGS. 3 and 4. For example, when the third embodiment is applied to a semiconductor device as shown in FIGS. 3(a) and 3(b), inner leads (not shown) connected to the lead pins 22 are made of superconductive materials and a magnetic material 125 is provided on the device as shown in FIGS. 7(a) and 7(b). Also, when the third embodiment is applied to a semiconductor device as shown in FIGS. 3(c) and 3(d), the superconductive material also is provided on a path between the lead pin 24 and the semiconductor chip 23, but a magnetic material is further provided in the semiconductor device as shown in FIG. 6.

Figure 8:
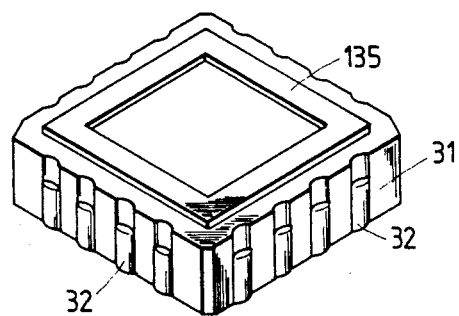

In addition, when the third embodiment is applied to a semiconductor device package as shown in FIG. 4(a), inner leads (not shown) made of superconductive materials are provided and a magnetic means 135 for adjusting the critical current is fixed on the device as shown in FIG. 8. Thus, in the device shown in FIG. 8, the superconductive materials are provided as in the devices shown in FIGS. 6 and 7.

While a few embodiments of the invention have been described in detail above, it is to be particularly understood that the invention is not limited thereto or thereby and can be modified or changed in various manners.

For example, of all the external terminals, only those which may receive overcurrents may be provided with conducting members of superconducting material. Alternatively, conducting members of superconducting material may be provided for all of the external terminals, and the magnetic means may be provided for some of the external terminals. Furthermore, the package shown in FIG. 6 may be so modified that the sealing member is made of superconducting material, and the sealing member receives current to form a magnetic field. In addition, in the package of FIG. 6, the magnetic elements may be replaced by chip coils. Any of a variety of other semiconductor packages also are available.

As was described in detail above, when an overcurrent applied to an external terminal of the semiconductor device of the present invention exceeds the critical current value of the superconducting material, a resistance is provided, thus protecting the semiconductor chip inside the device from damage. Furthermore, in the semiconductor device of the invention the critical current value can be adjusted by the use of magnetic fields as described. Therefore, the semiconductor device of the invention, though simple in construction, can protect the semiconductor chip from overcurrent with the high frequency characteristic remaining unchanged, and also can set the overcurrent allowable value to a desired value.

These and other beneficial features are believed to be included within the scope of the invention as defined by the following claims.

What is claimed is:

1. A semiconductor device, comprising:
    a semiconductor package;
    a semiconductor chip, having electrode pads, disposed inside of said package;
    outer terminals disposed on the outside of said package; and
    current flow paths electrically connecting said electrode pads with said outer terminals, at least portion of said current flow paths being made of a superconducting material maintained at a temperature lower than the critical temperature of said superconducting material and having a critical current value that is lower than the maximum allowable current value of said semiconductor chip so that the electrical resistance value of said superconducting material will change from zero to a finite value before the maximum allowable current value of said semiconductor chip is reached so as to cause a voltage drop across said superconducting material thus reducing the power dissipated by said semiconductor chip.

2. A semiconductor device as claimed in claim 1, further comprising:
    means for applying a magnetic field to said superconducting material so as to control said critical current value.

3. A semiconductor device, comprising:
    a semiconductor package;
    a semiconductor chip, having electrode pads, disposed inside of said package;
    signal terminals disposed on the outside of said package;
    monitor terminals disposed on the outside of said package; and
    current flow paths, each electrically connecting one of said electrode pads with one of said signal terminals, at least a portion of said current flow paths being made of a superconducting material maintained at a temperature lower than the critical temperature of said super conducting material and having a critical current value that is lower than the maximum allowable current value of said semiconductor chip so that the electrical resistance value of said superconducting material will change from zero to a finite value before the maximum allowable current value of said semiconductor chip is reached so as to cause a voltage drop across said superconducting material thus reducing the power dissipated by said semiconductor chip, an end of said portion of said current flow path which is connected to one of said electrode pads also being electrically connected to one of said monitoring terminals so as to allow monitoring of a potential difference between one of said signal terminals and a corresponding one of said monitoring terminals when the critical current value of said superconductor material is exceeded.

4. A semiconductor device as claimed in claim 3, further comprising:
    means for applying a magnetic field to said superconducting material so as to control said critical current value.

* * * * *